(12) United States Patent
Coffy

(10) Patent No.: US 12,389,526 B2
(45) Date of Patent: Aug. 12, 2025

(54) ELECTRONIC CIRCUIT

(71) Applicant: STMicroelectronics (Grenoble 2) SAS, Grenoble (FR)

(72) Inventor: Romain Coffy, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 234 days.

(21) Appl. No.: 17/982,913

(22) Filed: Nov. 8, 2022

(65) Prior Publication Data

US 2023/0164905 A1 May 25, 2023

(30) Foreign Application Priority Data

Nov. 23, 2021 (FR) ...................................... 2112395

(51) Int. Cl.
| | |
|---|---|
| *H05K 1/14* | (2006.01) |
| *H05K 1/02* | (2006.01) |
| *H05K 7/20* | (2006.01) |

(52) U.S. Cl.
CPC ........... *H05K 1/0212* (2013.01); *H05K 1/144* (2013.01); *H05K 2201/06* (2013.01)

(58) Field of Classification Search
CPC ... H05K 1/0212; H05K 1/144; H05K 2201/06
USPC ....................................................... 361/720
See application file for complete search history.

(56) References Cited

U.S. PATENT DOCUMENTS

| | | | | |
|---|---|---|---|---|
| 9,842,799 B2* | 12/2017 | Jang | ...................... | H01L 25/105 |
| 12,062,639 B2* | 8/2024 | Yoo | ........................ | H01L 23/367 |
| 2001/0032738 A1* | 10/2001 | Dibene, II | ........... | H05K 7/1092 |
| | | | | 361/767 |
| 2006/0033199 A1* | 2/2006 | Kawakami | ............. | H05K 1/186 |
| | | | | 257/E23.105 |
| 2009/0168367 A1* | 7/2009 | Fujii | ................... | H01L 23/3677 |
| | | | | 361/720 |
| 2012/0061849 A1* | 3/2012 | Coffy | .................. | H01L 23/3128 |
| | | | | 257/734 |
| 2012/0119346 A1* | 5/2012 | Im | .......................... | H01L 23/42 |
| | | | | 257/E23.18 |
| 2013/0214425 A1* | 8/2013 | Marais | ................ | H01L 23/3677 |
| | | | | 257/E23.168 |
| 2015/0054148 A1* | 2/2015 | Jang | ...................... | H01L 25/105 |
| | | | | 257/713 |
| 2015/0102500 A1* | 4/2015 | Coffy | ................ | H01L 23/49833 |
| | | | | 257/774 |
| 2016/0111396 A1* | 4/2016 | Kim | ....................... | H01L 24/97 |
| | | | | 438/109 |
| 2018/0233429 A1 | 8/2018 | Yosui et al. | | |
| 2021/0151411 A1* | 5/2021 | Cho | .................... | H01L 23/5389 |
| 2022/0173082 A1* | 6/2022 | Kim | .................. | H01L 23/5389 |

(Continued)

*Primary Examiner* — Anatoly Vortman
(74) *Attorney, Agent, or Firm* — Crowe & Dunlevy LLC

(57) ABSTRACT

An electronic circuit includes an upper substrate and a lower substrate. An electronic integrated circuit chip is positioned between the upper and lower substrates. The chip includes contact elements coupled to the upper substrate. A first region made of a first material is arranged between the chip and a heat transfer area crossing the lower substrate. A second region filled with a second material couples the lower and upper substrates and laterally surrounds the first region. The first material has a thermal conductivity greater than a thermal conductivity of the second material.

24 Claims, 6 Drawing Sheets

(56) References Cited

U.S. PATENT DOCUMENTS

2022/0320043 A1\* 10/2022 Yoo .................. H01L 24/17
2023/0137239 A1\* 5/2023 Boutaleb ............ H01L 23/433
                                                    257/712

\* cited by examiner

ELECTRONIC CIRCUIT

PRIORITY CLAIM

This application claims the priority benefit of French Application for Patent No. 2112395, filed on Nov. 23, 2021, the content of which is hereby incorporated by reference in its entirety to the maximum extent allowable by law.

TECHNICAL FIELD

The present disclosure generally concerns electronic circuits and their manufacturing methods and, in particular, electronic circuits comprising electronic chips embedded in substrates.

BACKGROUND

To be protected from environmental conditions, such as humidity, existing electronic circuits may comprise elements embedded in resins by a molding process. These resins particularly limit the dissipation of the heat generated within electronic circuits. Further, mold embedded package assemblies have been provided to make electronic circuits more compact. In particular, in such assemblies, electronic chips are embedded in resins formed by molding. However, in this type of assembly, heat dissipation becomes critical. The resulting heating limits the performance and is a source of failure.

There is a need to improve heat dissipation within electronic circuits or when they are stacked.

SUMMARY

An embodiment overcomes all or part of the disadvantages of known electronic circuits.

An embodiment provides an electronic circuit comprising: an upper substrate and a lower substrate; an electronic integrated circuit chip between the upper and lower substrates, and having contact elements coupled to the upper substrate; a first region made of a first material and arranged between the chip and a heat transfer area crossing the lower substrate; and a second region filled with a second material, and coupling the lower and upper substrates; wherein the first material has a thermal conductivity greater than a thermal conductivity of the second material.

According to an embodiment, first heat conduction elements are arranged between the upper and lower substrates, with the first heat conduction elements fastened to the upper and lower substrates.

According to an embodiment, the circuit comprises a third region, made of a third electrically-insulating material, and arranged between a surface of the chip facing the upper substrate and the upper substrate, the third region at least partly surrounding the contact elements of the chip.

According to an embodiment, the heat transfer area comprises an opening crossing the thickness of the lower substrate vertically in line with the electronic chip.

According to an embodiment, the first material at least partially fills the opening.

According to an embodiment, the heat transfer area comprises a heat conductor arranged in the opening and having a greater thermal conduction than the second material.

According to an embodiment, the heat transfer area comprises at least one thermal conduction element arranged on a surface of the lower substrate facing the upper substrate and arranged in contact with the heat conductor; said at least one thermal conduction element having a greater thermal conduction than the second material.

According to an embodiment, the heat conductor is an electrically-conductive plate.

According to an embodiment, the thermal conduction element is an electrically-conductive plate and the heat conductor is a metal via filling the opening.

According to an embodiment, the thermal conduction element or the heat conductor comprises copper or an alloy of nickel and gold.

An embodiment provides a method of manufacturing an electronic circuit comprising: applying a first material to a heat transfer area of a lower substrate; positioning an upper substrate so that the first material is arranged in a first region between at least one electronic chip, having contact elements coupled to the upper substrate, and the heat transfer area of the lower substrate; and filling with a second material a second region coupling the lower and upper substrates, the first material having a thermal conductivity greater than the thermal conductivity of the second material.

According to an embodiment, the heat transfer area is obtained prior to the application of the first material: by providing an opening crossing the thickness of the lower substrate; and by laying a first surface of the lower substrate on a film, the first surface facing a direction opposite to the upper substrate, so that the opening is obstructed on the first surface side by said film.

According to an embodiment, after the upper substrate has been positioned, a curing treatment is applied to the first material; and after the second material fills the second region, another curing treatment is applied thereto, after which the film is removed.

According to an embodiment, the upper and/or lower substrates comprise a stack of electric tracks coupling contact pads arranged on either side of the thickness of said substrates.

An embodiment provides an electronic system comprising such an electronic circuit and at least another electronic circuit positioned on the upper substrate and at least thermally coupled to the upper substrate of the electronic circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the inner components of the electronic circuits such as transistors, memories, or also inner interconnects, have not been shown.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
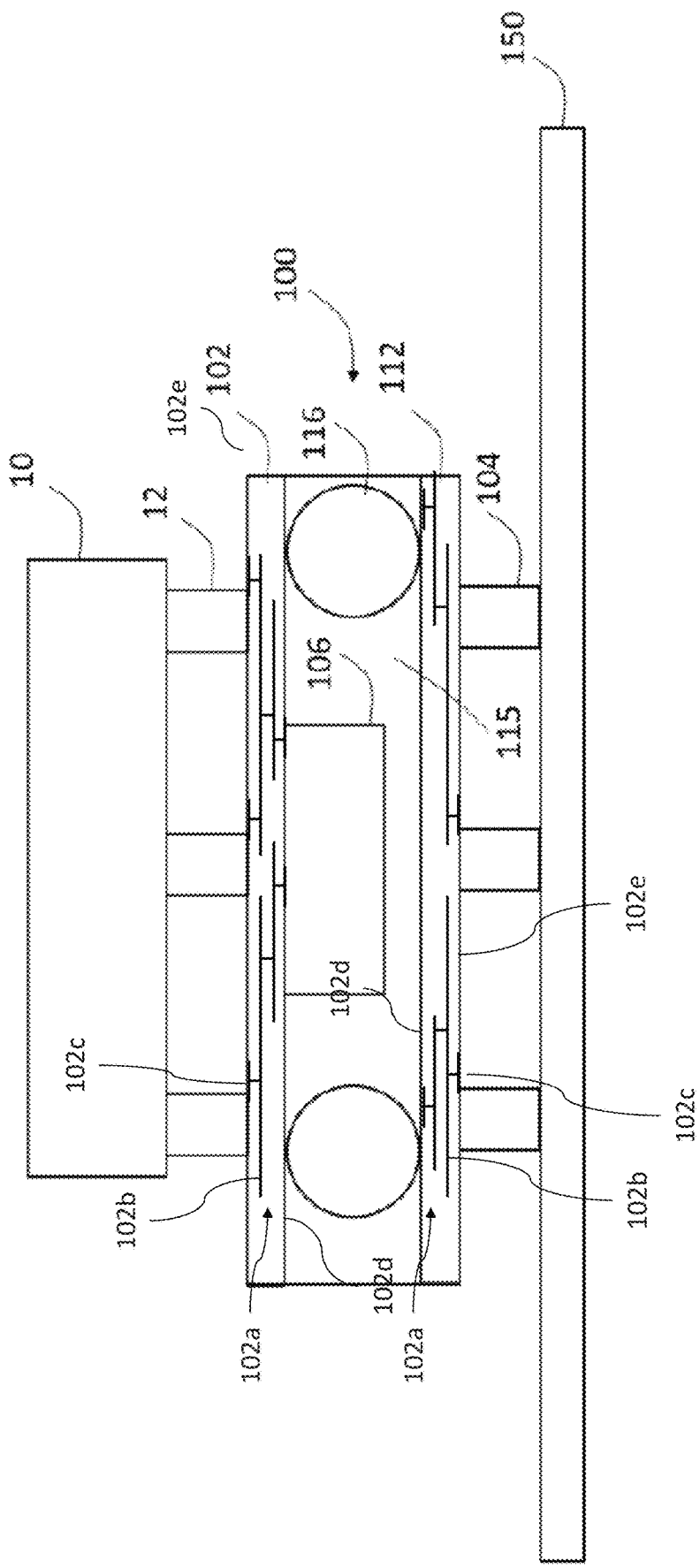
FIG. 1 schematically shows in cross-section view an example of assembly of electronic circuits.

FIG. 1 schematically shows in cross-section view an example of a stack of electronic circuits. The stack comprises an electronic circuit 10 arranged above another electronic circuit 100. The two circuits 10, 100 are coupled together by contacts 12 which are, for example, electric conductors. These contacts 12 also enable to transfer the heat generated by circuit 10, arranged above, towards circuit 100, arranged below, and conversely. According to the example of FIG. 1, circuit 100 is an assembly of substrates with embedded electronic integrated circuit chips and comprises, for example, an upper substrate 102 and a lower substrate 112. At least one electronic integrated circuit chip 106 is arranged between upper substrate 102 and lower substrate 112. Electronic chip 106 is electrically coupled to upper substrate 102. According to another example, not illustrated, instead of being coupled to upper substrate 102, chip 106 is coupled to lower substrate 112. A material 115 is totally or partly arranged around electronic chip 106. Material 115, for example, fills the space between lower and upper substrates 112, 102 around chip 106. This enables to insulate the electronic chip from environmental factors such as humidity. However, this implies that the heat originating from circuit 10, as well as the heat generated by circuit 100 itself, are not sufficiently dissipated towards a substrate 150.

In the example of FIG. 1, circuit 100 is further electrically coupled, via other contacts 104, to the substrate 150. This substrate 150, for example, comprises a printed circuit having contacts 104 coupled thereto.

According to an example, each of substrates 102, 112 comprises a stack 102a of electric tracks 102b coupling contact pads 102c arranged on the inner surface 102d and outer surface 102e located on opposite sides of the thickness of each of these substrates 102, 112. For example, upper substrate 102 comprises contact pads 102c at outer surface 102e coupled to contacts 12 and coupled by stacks of electric tracks 102b to contact pads 102c at inner surface 102d coupled to chip 106. This enables to create stacks or assemblies of electrically-connected or thermally-connected circuits.

To improve the heat dissipation, electronic circuit 100 may, for example, comprise conductive balls 116 arranged to create a heat dissipation path through material 115. These balls 116, for example, enable to dissipate the heat of circuit 10 through circuit 100. However, the heat generated by chip 106 is not sufficiently dissipated by these balls, and this may cause hot spots and result in failures.

Figure 2:
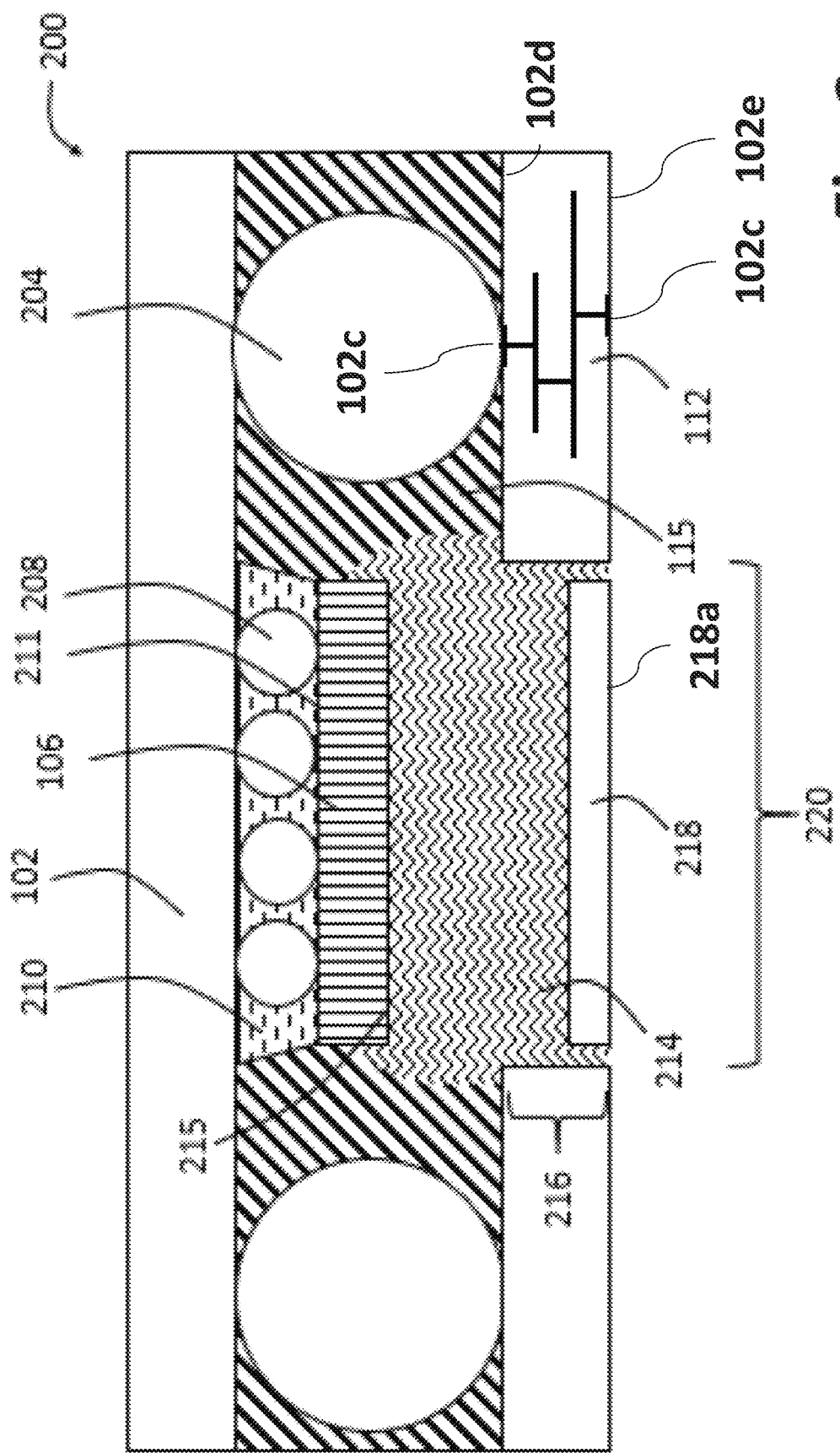
FIG. 2 schematically shows in cross-section view an electronic circuit according an embodiment of the present description.

FIG. 2 schematically shows in cross-section view an example of an electronic circuit 200 according to an embodiment of the present disclosure. This electronic circuit 200 may be used in an assembly of circuits such as shown in FIG. 1 instead of circuit 100, or also in other types of assemblies, or alone as such.

According to the example of FIG. 2, electronic circuit 200 comprises upper substrate 102 and lower substrate 112 which are similar to those of the electronic circuit 100 of FIG. 1.

In FIG. 2, elements, for example, electrically-conductive and/or thermally-conductive balls 204, are arranged between upper substrate 102 and lower substrate 112. According to an example, balls 204 are fastened to upper and lower substrates 102, 112, for example via a thermal treatment or via a treatment with the application of mechanical and/or ultrasound forces. According to an example, these balls 204 electrically couple electric tracks of the two substrates 102, 112. Balls 204 may be replaced with pillars or with conductive elements, the shape of which will result from the knowledge of those skilled in the art. Although they are illustrated in FIG. 2, balls 204 may be absent between the two substrates 102, 112.

As in the example of FIG. 1, electronic integrated circuit chip 106 is arranged between upper substrate 102 and lower substrate 112. Contact elements 208, belonging to electronic chip 106, are coupled, for example, electrically, to upper substrate 102 or to conductive elements of upper substrate 102. An electrically-insulating material 210, which is for example an underfill (UF) resin, is arranged in a region located between a surface 211 of chip 106 facing upper substrate 102 and upper substrate 102. Material 210 further at least partly surrounds the contact elements 208 of chip 106. Material 210 may, for example, be provided to cure under the action of a UV or thermal treatment so as to protect contact elements 208, by avoiding, for example, humidity penetration towards electronic chip 106 or between contact elements 208. In an example, not illustrated, material 210 is not present.

According to the example of FIG. 2, material 115, which is similar to that of FIG. 1, couples, in a filling region, the lower and upper substrates 112 and 102. The filling region is further arranged, in FIG. 2, between balls 204 and electronic chip 106. Material 115 is, for example, configured, once introduced at the level of the filling region, to become solid after the application of a treatment, for example, thermal or based on ultraviolet radiation. Material 115 is, for example, a molding resin such as a coating material made of epoxy resin and, for example, comprising inclusions of silica elements. According to an example, material 115 may be a material having trade name Nitto Denko GE100LF-1 (name Nitto Denko may be protected by one or a plurality of marks). Material 115 is electrically insulating.

According to the example of FIG. 2, a material 214 is arranged between chip 106 and a heat transfer area 216 crossing lower substrate 112. Material 214 is in contact, for example, with at least a portion of a lower surface 215 of chip 106. Material 214 may further be arranged in contact with at least a portion of the lateral edges of electronic chip 106. The region filled by material 214 is laterally surrounded by the material 115 of the filling region between the lower and upper substrates 112 and 102.

According to an example, material 214 is electrically conductive. Material 214 is, for example, resin or thermal glue filled with silver elements. According to another example, material 214 is electrically insulating. According to an example, material 214 has a thermal conductivity greater than that of filling material 115. This enables to improve the dissipation of heat, particularly originating from chip 106, through transfer area 216. According to an example, the thermal conductivity of filling material 115 is approximately 1 W/mK and that of material 214 is of at least from 2 to 3 W/mK.

In an example, not illustrated, material 214 is further arranged around contact elements 208 as well as between the surface 211 of chip 106 and upper substrate 102. In this case, material 210 is totally or partly absent and material 214 is insulating.

According to the example of FIG. 2, transfer area 216 is formed in an opening 220 formed through lower substrate 112. Opening 220 is, for example, formed vertically in line with electronic chip 206 to ease the heat dissipation at the level of electronic chip 106.

According to an example, not illustrated, material 214 totally fills opening 220.

According to the example of FIG. 2, heat transfer area 216 comprises a heat conductor 218 arranged in opening 220 and having a greater thermal conductivity than filling material 115. In the example of FIG. 2, material 214 fills the portion of the opening which is not filled with heat conductor 218. The heat conductor 218 has a bottom surface 218a that is coplanar with the outer surface 102e of the substrate 112.

Heat conductor 218 is, for example, a plate made of a metal, or a metal deposit, made of copper or of a nickel and gold alloy, or also a non-metal electrically-conductive plate. According to an example, heat conductor 218 is advantageously configured to be able to be easily soldered to a support substrate, such as the substrate 150 of FIG. 1, possibly via contacts 104 or a mass of solder paste, which, for example, couples heat conductor 218 to a metal contact pad (not illustrated) on substrate 150. These solutions enable to improve the heat transfer.

The example of FIG. 2 provides a dissipation of the heat generated by chip 106, improved with respect to the example of FIG. 1.

Figure 3:
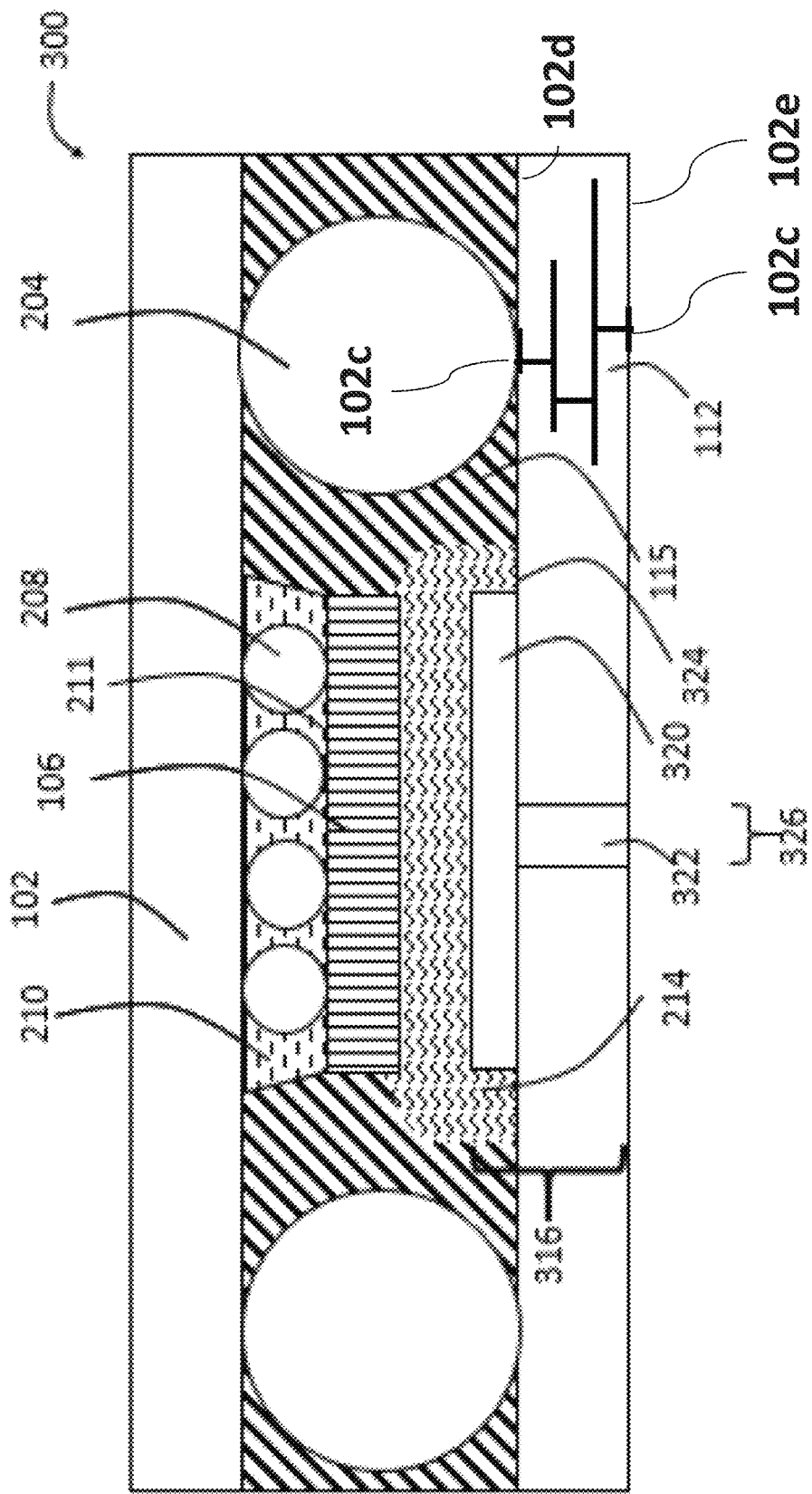
FIG. 3 schematically shows in cross-section view an electronic circuit according to another embodiment of the present disclosure.

FIG. 3 schematically shows an electronic circuit 300 according to another embodiment of the present disclosure. The electronic circuit of FIG. 3 is similar to that of FIG. 2, except that heat transfer area 216 is replaced with a heat transfer area 316. Instead of opening 220, heat transfer area 316 comprises at least one thermal conduction element 320, that may be similar to thermal conductor 218, but which is arranged on a surface 324 of lower substrate 112 facing upper substrate 102.

According to the example of FIG. 3, material 214 may be further arranged between the lateral edges of thermal conduction element 320 and surface 324.

Thermal conduction element 320 is, for example, arranged in thermal and/or electric contact with at least one via 322 which is thermally and possibly electrically conductive and which, for example, totally or partially fills an opening 326 crossing lower substrate 112. Via(s) 322 are, for example, made of copper and/or of nickel and/or of gold and/or of metal.

According to an example, not illustrated, a plurality of openings 326, similar to that of FIG. 3, are arranged in parallel fashion through lower substrate 112. In this example, a plurality of vias similar to via 322 may be arranged in said openings 326.

According to an example, said at least one thermal conduction element 320 and/or via 322 have a greater thermal conduction than material 115.

The example of FIG. 3 provides an improved heat dissipation, of the heat generated by chip 106, as compared with the example of FIG. 1.

Figure 4:
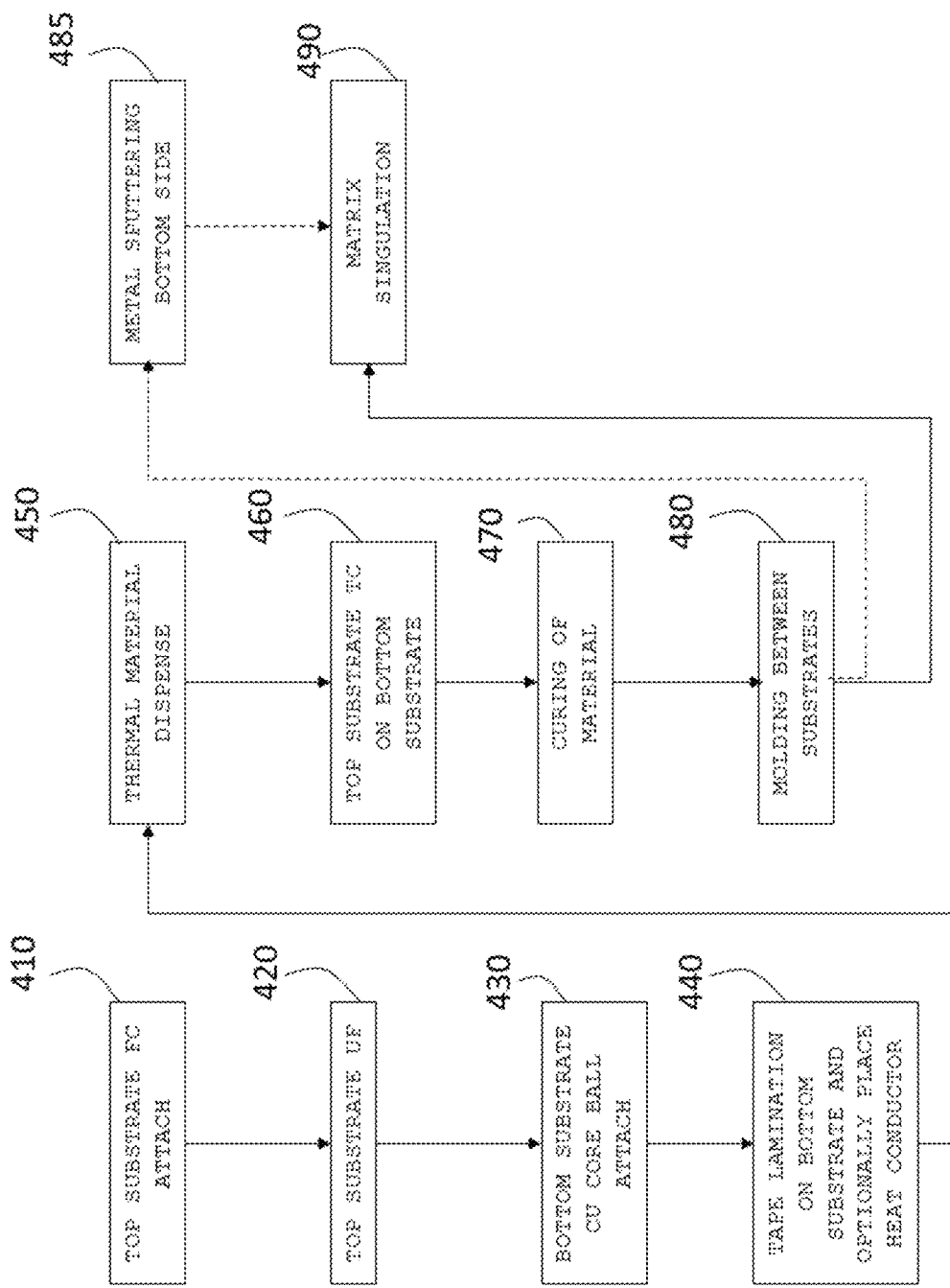
FIG. 4 shows, in the form of blocks, different steps of a method of manufacturing an electronic circuit according to an embodiment of the present disclosure.

FIG. 4 shows, in the form of blocks for a flow diagram, steps of a method of manufacturing the electronic circuit 200 of FIG. 2, according to an embodiment of the present disclosure. The way to adapt this method for the manufacturing of the electronic circuit 300 of FIG. 3 will readily occur to those skilled in the art.

FIGS. 5a to 5g schematically show in cross-section view different steps of the manufacturing method of FIG. 4.

The manufacturing steps of FIG. 4 will be described with reference to FIGS. 5a to 5g.

Figure 5A:
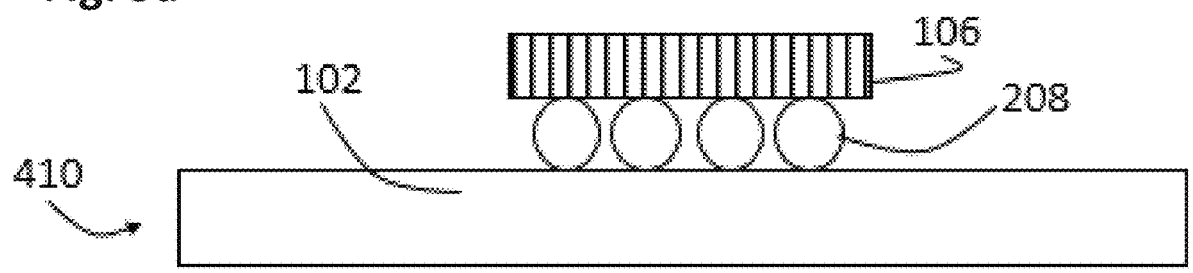
FIGS. 5a to 5g schematically show in cross-section view different steps of the manufacturing method of FIG. 4.

At a step 410 (TOP SUBSTRATE FC ATTACH), and as illustrated in FIG. 5a, the contact elements 208 of electronic chip 106 are coupled, for example electrically and/or thermally, to upper substrate 102. At this step, upper substrate 102 may be arranged so that the electronic chip and contact elements 208 are above upper substrate 102.

Figure 5B:
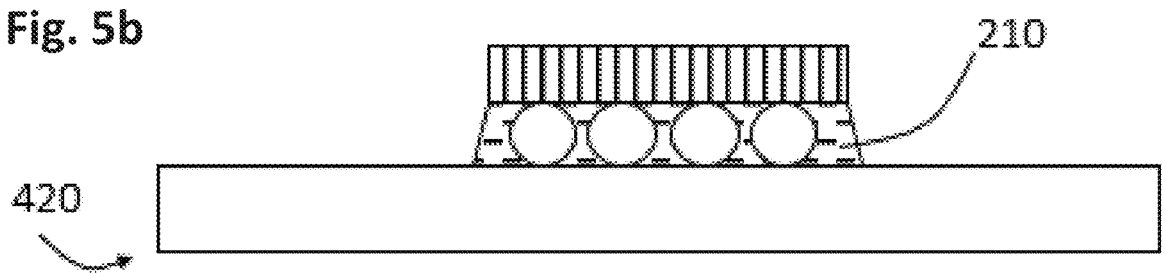

At a step 420 (TOP SUBSTRATE UF), and as illustrated in FIG. 5b, material 210 is introduced between contact elements 208 and upper substrate 102. According to an example, material 210 is introduced at the level of the outermost contact elements 208 and by capillarity material 210 fills the space located between the centermost contact elements, the electronic chip, and upper substrate 102. A thermal and/or ultra-violet treatment may be envisaged to cure material 210.

Figure 5C:
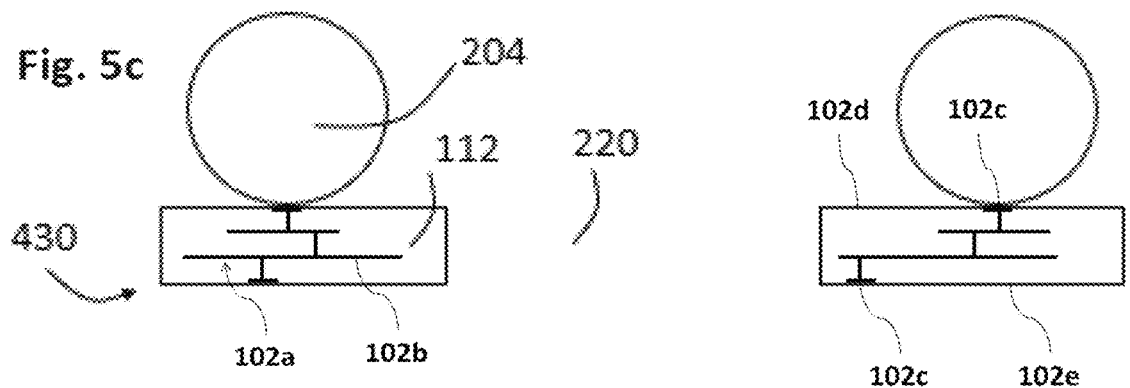

At a step 430 (BOTTOM SUBSTRATE CU CORE BALL ATTACH), and as illustrated in FIG. 5c, balls 204 are fastened to an inner surface 102d of the lower substrate 112. Lower substrate 112 comprises prior to this step the provision of opening 220 which extends completely through a thickness of lower substrate between the inner surface 102d and the outer surface 102e (opposite the inner surface 102d).

Figure 5D:
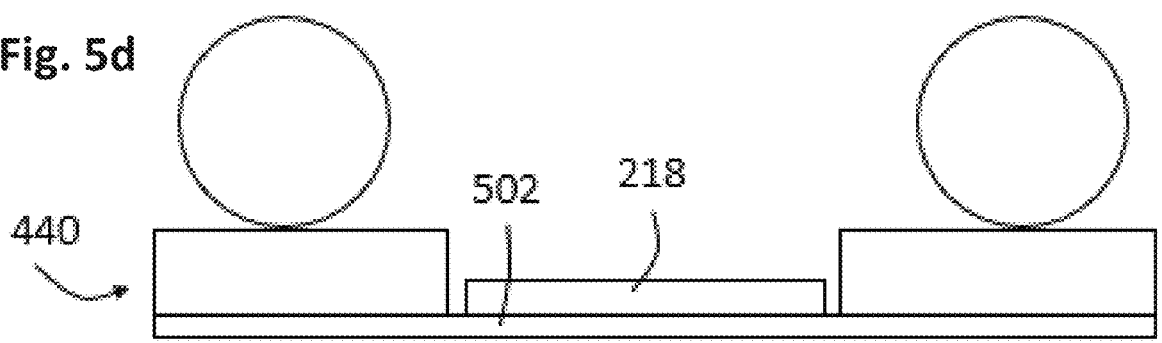

At a step 440 (TAPE LAMINATION ON BOTTOM SUBSTRATE AND OPTIONALLY PLACE HEAT CONDUCTOR), and as illustrated in FIG. 5d, an outer surface of lower substrate 112 is laminated with a film 502, for example, adhesive. According to an example of step 440, heat conductor 218 is arranged on the film to be arranged in opening 220 after lamination. For example, lower substrate 112 and heat conductor 218 are sequentially laid on film 502.

Figure 5E:
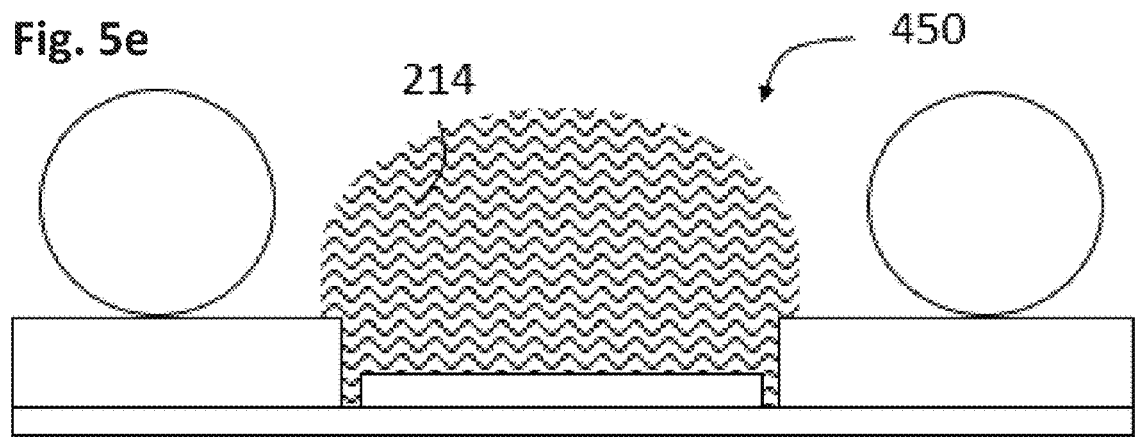

At a step 450 (THERMAL MATERIAL DISPENSE), and as illustrated in FIG. 5e, material 214 is dispensed at the level of opening 220 on the film.

Figure 5F:
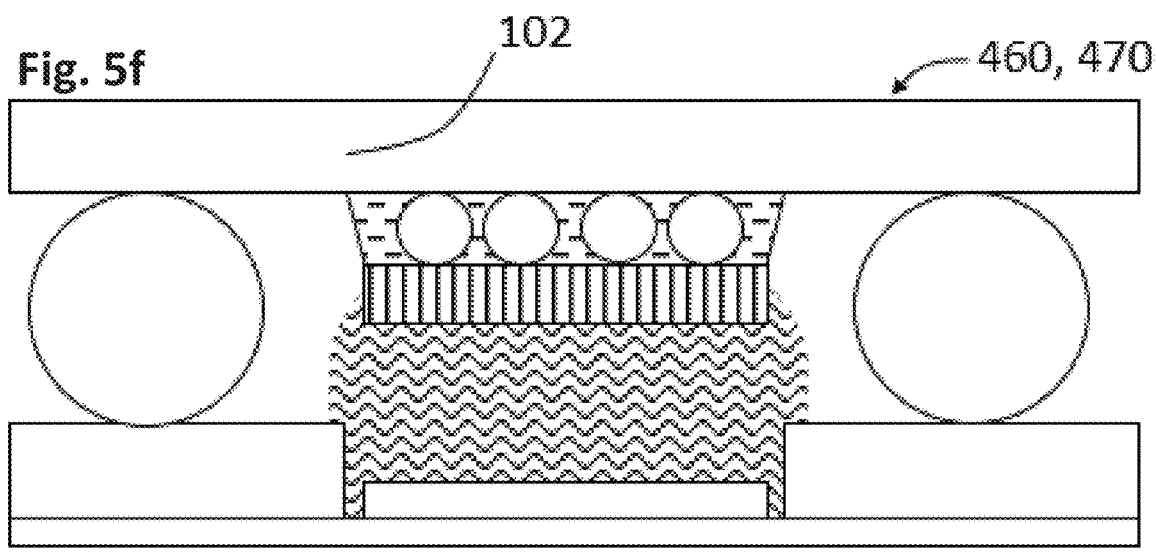

At a step 460 (TOP SUBSTRATE TC ON BOTTOM SUBSTRATE), and as illustrated in FIG. 5f, upper substrate 106 is arranged above lower substrate 112 so that electronic chip 106 is aligned with opening 220, that is, with the material 214 that has been dispensed at the level of opening 220. Further, chip 106 is placed in contact with material 214. Upper substrate 102 is then placed in contact with balls 204 and bonded thereto by application of a relative force between the two substrates 102, 112 and/or of a thermal or ultrasound treatment.

At a step 470 (CURING OF MATERIAL), and as illustrated in FIG. 5f, a treatment is applied to circuit 200. This treatment for example comprises ultraviolet rays and/or a thermal treatment and/or with the application of a pressure. At the end of this step, material 214 has totally or partly cured and enables to hold in place heat conductor 218.

Figure 5G:
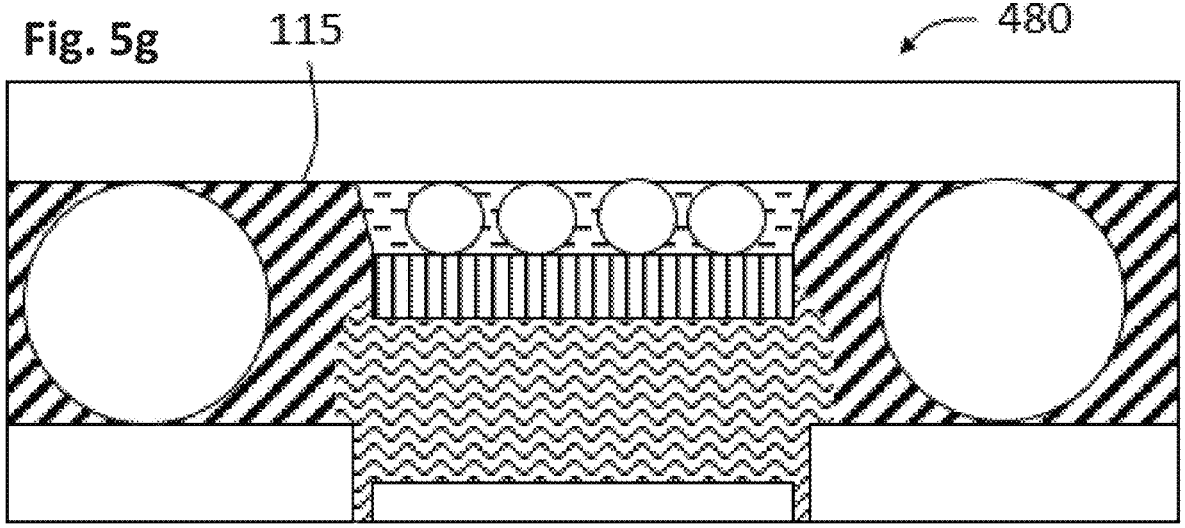

At a step 480 (MOLDING BETWEEN SUBSTRATES) and as illustrated in FIG. 5g, filling material 115 is dispensed, in the liquid or viscous state, in the remaining free spaces between the two substrates 102, 112. A treatment may then be implemented to solidify material 115. Film 502 may then be removed if necessary so that heat conductor 218, if present, remains attached to material 214.

An optional step 485 (METAL SPUTTERING BOTTOM SIDE), which is illustrated in dotted lines, corresponds to the case where a heat conductor 218 is not present on the film at the time when the film is laminated and material 214 is dispensed. In this case, it is possible to envisage a deposition, for example, a vacuum vapor or plasma deposition, of heat conductor 218 in the form of a layer arranged, on material 214, at the level of the opening on the outer surface side of lower substrate 112.

At a step 490 (MATRIX SINGULATION), when a plurality of chips are present, it is possible to envisage a cutting across the thickness of the electronic circuit to form circuits having one chip or a defined number of chips. The electronic circuits thus formed might optionally be introduced into assemblies or stacks and will provide an improved heat dissipation.

Various embodiments and variants have been described. Those skilled in the art will understand that certain features of these various embodiments and variants may be combined, and other variants will occur to those skilled in the art. For example, although examples of electronic circuits 200, 300 comprising a single chip have been described, those skilled in the art will understand how to extend the embodiments to the case where there are a plurality of chips 106 per circuit and arranged in parallel, each chip being associated to its own material 214 and to its own heat transfer area 216 or 316.

Finally, the practical implementation of the described embodiments and variations is within the abilities of those skilled in the art based on the functional indications given hereabove.

The invention claimed is:

1. An electronic circuit, comprising:
   an upper substrate;
   a lower substrate including an opening passing completely through a thickness of the lower substrate between an inner surface and an outer surface opposite the inner surface to provide a heat transfer area;
   an electronic chip positioned between the upper and lower substrates and having contact elements coupled to the upper substrate;
   a first region, made of a first material, arranged between the electronic chip and the heat transfer area; and
   a second region, filled with a second material, coupling the lower and upper substrates;
   wherein the first material has a thermal conductivity greater than a thermal conductivity of the second material.

2. The circuit according to claim 1, further comprising first heat conduction elements arranged between the upper and lower substrates, the first heat conduction elements being fastened to the upper substrate and fastened to the inner surface of the lower substrate.

3. The circuit according to claim 1, further comprising a third region, made of a third electrically-insulating material, arranged between the upper substrate and a surface of the electronic chip facing the upper substrate, the third region at least partly surrounding the contact elements of the electronic chip.

4. The circuit according to claim 1, wherein the opening is vertically in line with the electronic chip.

5. The circuit according to claim 1, wherein the first material at least partially fills the opening.

6. The circuit according to claim 1, further comprising a heat conductor arranged in the opening, said heat conductor having a thermal conductivity greater than the thermal conductivity of the second material.

7. The circuit according to claim 6, further comprising a thermal conduction element arranged on the inner surface of the lower substrate facing the upper substrate and arranged in contact with the heat conductor;
   said thermal conduction element having a thermal conductivity greater than the thermal conductivity of the second material.

8. The circuit according to claim 7, wherein the heat conductor is an electrically-conductive plate.

9. The circuit according to claim 7, wherein the thermal conduction element is an electrically-conductive plate and the heat conductor is a metal via filling the opening.

10. The circuit according to claim 7, wherein the thermal conduction element is made of a material selected from the group consisting of copper or a nickel and gold alloy, and wherein the heat conductor is made of a material selected from the group consisting of copper or a nickel and gold alloy.

11. The circuit according to claim 1, wherein said second region filled with the second material laterally surrounds the first region made of the first material.

12. The circuit according to claim 1, wherein the lower substrate comprises a stack of electric tracks coupling contact pads arranged at the inner surface to contact pads arranged at the outer surface.

13. An electronic system, comprising:
   an electronic circuit according to claim 1; and
   at least another electronic circuit positioned on the upper substrate and at least thermally coupled to the upper substrate of the electronic circuit.

14. The circuit according to claim 6, wherein the heat conductor is a metal plate having a surface coplanar with the outer surface of the lower substrate.

15. The circuit according to claim 14, wherein the first material contacts the metal plate opposite the surface coplanar with the outer surface of the lower substrate.

16. An electronic circuit, comprising:
   an upper substrate;
   a lower substrate including an opening passing completely through a thickness of the lower substrate between an inner surface and an outer surface opposite the inner surface;
   an electronic chip positioned between the upper and lower substrates and having contact elements coupled to the upper substrate;
   a first region, made of a first material, arranged between the electronic chip and the lower substrate, said first material further extending into the opening in the lower substrate;
   a second region, filled with a second material, coupling the lower and upper substrates and surrounding the first region;
   wherein the first material has a thermal conductivity greater than a thermal conductivity of the second material; and
   a thermal conductive plate arranged in the opening, the thermal conductive plate having a bottom surface coplanar with the outer surface of the lower substrate.

17. The circuit according to claim 16, further comprising first heat conduction elements arranged between the upper and lower substrates, the first heat conduction elements being fastened to the upper and lower substrates.

18. The circuit according to claim 16, further comprising a third region, made of a third electrically-insulating material, arranged between the upper substrate and a surface of the electronic chip facing the upper substrate, the third region at least partly surrounding the contact elements of the electronic chip.

19. The circuit according to claim 16, wherein the lower substrate comprises a stack of electric tracks coupling contact pads arranged at the inner surface of the lower substrate to contact pads arranged at the outer surface of the lower substrate.

20. The circuit according to claim 16, wherein the first material contacts the thermal conductive plate opposite the bottom surface coplanar with the outer surface of the lower substrate.

21. An electronic circuit, comprising:
an upper substrate;
a lower substrate including an opening passing completely through a thickness of the lower substrate between an inner surface and an outer surface opposite the inner surface;
an electronic chip positioned between the upper and lower substrates and having contact elements coupled to the upper substrate;
a thermal conductive plate mounted to the inner surface of the lower substrate and covering the opening;
a thermal conductive via in the opening;
a first region, made of a first material, arranged between the electronic chip and the lower substrate, said first material encapsulating the conductive plate;
a second region, filled with a second material, coupling the lower and upper substrates and surrounding the first region; and
wherein the first material has a thermal conductivity greater than a thermal conductivity of the second material.

22. The circuit according to claim 21, further comprising first heat conduction elements arranged between the upper and lower substrates, the first heat conduction elements being fastened to the upper and lower substrates.

23. The circuit according to claim 21, further comprising a third region, made of a third electrically-insulating material, arranged between the upper substrate and a surface of the electronic chip facing the upper substrate, the third region at least partly surrounding the contact elements of the electronic chip.

24. The circuit according to claim 21, wherein the lower substrate comprises a stack of electric tracks coupling contact pads arranged at the inner surface of the lower substrate to contact pads arranged at the outer surface of the lower substrate.

* * * * *